United States Patent
Chen et al.

(10) Patent No.: US 10,461,002 B2
(45) Date of Patent: Oct. 29, 2019

(54) FABRICATION METHOD OF ELECTRONIC MODULE

(71) Applicant: Siliconware Precision Industries Co., Ltd., Taichung (TW)

(72) Inventors: Lu-Yi Chen, Taichung (TW); Chang-Lun Lu, Taichung (TW); Shih-Ching Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 92 days.

(21) Appl. No.: 15/646,695

(22) Filed: Jul. 11, 2017

(65) Prior Publication Data

US 2017/0309534 A1  Oct. 26, 2017

Related U.S. Application Data

(62) Division of application No. 14/516,010, filed on Oct. 16, 2014, now Pat. No. 9,735,075.

(30) Foreign Application Priority Data

Sep. 3, 2014  (TW) .............................. 103130349 A

(51) Int. Cl.
| | |
|---|---|
| H05K 13/00 | (2006.01) |
| H01L 23/16 | (2006.01) |
| H01L 23/31 | (2006.01) |
| H01L 23/00 | (2006.01) |
| H01L 21/56 | (2006.01) |

(52) U.S. Cl.
CPC .......... *H01L 23/16* (2013.01); *H01L 23/3114* (2013.01); *H01L 24/19* (2013.01); *H01L 24/20* (2013.01); *H01L 24/96* (2013.01); *H01L 24/97* (2013.01); *H01L 21/561* (2013.01); *H01L 21/568* (2013.01); *H01L 23/562* (2013.01); *H01L 2224/04105* (2013.01); *H01L 2224/12105* (2013.01); *H01L 2924/18162* (2013.01); *Y10T 29/49169* (2015.01)

(58) Field of Classification Search
CPC ..... H01L 2924/181; H01L 2221/68327; H01L 21/02002; H01L 23/3135; H01L 23/28; H01L 23/3107; H01L 24/11; B24D 3/346; H05K 1/0298; H05K 1/183; H05K 2203/025; Y10S 438/977; Y10T 29/49; Y10T 29/49826; Y10T 29/49169; B24B 37/26
USPC ................................. 29/854, 825, 829, 855
See application file for complete search history.

(56) References Cited

U.S. PATENT DOCUMENTS

| | | | |
|---|---|---|---|
| 9,704,824 B2 * | 7/2017 | Lin | ...................... H01L 24/11 |
| 2005/0023704 A1 | 2/2005 | Lin et al. | |

* cited by examiner

*Primary Examiner* — Thiem D Phan
(74) *Attorney, Agent, or Firm* — Mintz Levin Cohn Ferris Glovsky and Popeo, P.C.; Peter F. Corless; Steven M. Jensen

(57) ABSTRACT

An electronic module is provided, including an electronic element and a strengthening layer formed on a side surface of the electronic element but not formed on an active surface of the electronic element so as to strengthen the structure of the electronic module. Therefore, the electronic element is prevented from being damaged when the electronic module is picked and placed.

11 Claims, 6 Drawing Sheets

FABRICATION METHOD OF ELECTRONIC MODULE

CROSS-REFERENCE TO RELATED APPLICATIONS

This application is a divisional of copending application U.S. Ser. No. 14/516,010, filed on Oct. 16, 2014, which claims under 35 U.S.C. § 119(a) the benefit of Taiwanese Application No. 103130349, filed Sep. 3, 2014, the entire contents of which are incorporated herein by reference.

BACKGROUND OF THE INVENTION

1. Field of the Invention

The present invention relates to electronic modules, and more particularly, to an electronic module and a fabrication method thereof so as to improve the product yield.

2. Description of Related Art

Along with the progress of electronic industries, electronic products are developed toward the trend of miniaturization and multi-function. Accordingly, various package types have been developed. To meet the demands of semiconductor devices for high integration, miniaturization and high electrical performance, flip-chip bonding technologies have been developed.

To achieve flip-chip bonding, a plurality of conductive bumps are formed on an active surface of a chip for electrically connecting the active surface of the chip to an external electronic device or a packaging substrate. As such, the size of the overall package structure is greatly reduced. Further, the structure dispenses with bonding wires as required in the prior art. As such, the electrical impedance of the structure is reduced, thereby improving the electrical performance and avoiding signal distortion during transmission. Therefore, flip-chip bonding technologies are becoming increasing popular.

FIG. 1 is a schematic exploded cross-sectional view of a conventional flip-chip package 1.

Referring to FIG. 1, the flip-chip package 1 has a chip 11 and a packaging substrate 9. The chip 11 has opposite active and inactive surfaces 11a, 11b. A plurality of electrode pads 12 are formed on the active surface 11a of the chip 11 and a plurality of solder balls 13 are correspondingly formed on the electrode pads 12. The substrate 9 has a plurality of conductive pads 90. The chip 11 is disposed on the packaging substrate 9 with the solder balls 13 correspondingly bonded to the conductive pads 90, thereby forming the flip-chip package 1.

However, the chip 11 has a low structural strength due to its exposed inactive surface 11b and side surface 11c. Therefore, when the flip-chip package 1 is picked up and placed at a suitable position and subjected to an SMT (Surface Mount Technology) process, cracking easily occurs to the chip 11, thus reducing the product reliability.

Therefore, how to overcome the above-described drawbacks has become critical.

SUMMARY OF THE INVENTION

In view of the above-described drawbacks, the present invention provides an electronic module, which comprises: an electronic element having an active surface with a plurality of electrode pads, an inactive surface opposite to the active surface, and a side surface connecting the active and inactive surfaces; and a strengthening layer formed on the side surface of the electronic element but not formed on the active surface of the electronic element.

The above-described electronic module can further comprise a separation portion formed on the strengthening layer on the side surface of the electronic element in a manner that the strengthening layer is sandwiched between the side surface of the electronic element and the separation portion.

In the above-described electronic module, the separation portion can have a width less than 1 mm.

The present invention further provides a method for fabricating an electronic module, which comprises the steps of: providing a substrate having a plurality of electronic elements and a plurality of separation portions each formed between adjacent two of the electronic elements, wherein each of the electronic elements has an active surface with a plurality of electrode pads and an inactive surface opposite to the active surface; forming at least an opening in each of the separation portions, causing each of the electronic elements to have a side surface connecting the active and inactive surfaces thereof; forming a strengthening layer in the openings of the separation portions and on the side surfaces of the electronic elements; and singulating the electronic elements along the separation portions.

In the above-described method, the separation portions can have a width in a range of 10 um to 4 mm.

In the above-described method, the singulation path along the separation portions can be less in width than the separation portions In the above-described method, if a plurality of openings are formed in each of the separation portions, the singulation path along the separation portion can be positioned between the openings of the separation portion.

In the above-described electronic module and method, the strengthening layer can be formed around the side surface of the electronic element.

In the above-described electronic module and method, the strengthening layer can be made of an insulating material.

In the above-described electronic module and method, the strengthening layer can further be formed on the inactive surface of the electronic element.

In the above-described electronic module and method, an RDL (Redistribution Layer) structure can further be formed on the strengthening layer, the separation portion and the active surface of the singulated electronic element and electrically connected to the electrode pads of the electronic element.

In the above-described electronic module and method, an RDL structure can further be formed on the strengthening layer and the active surface of the singulated electronic element and electrically connected to the electrode pads of the electronic element.

In the above-described electronic module and method, a plurality of conductive elements can be formed on the active surface of the electronic element and electrically connected to the electrode pads of the electronic element.

In the above-described electronic module and method, the singulated electronic element can be bonded to a packaging substrate via the active surface thereof.

Therefore, by forming the strengthening layer to encapsulate the inactive and side surfaces of the electronic element, the present invention strengthens the structure of the electronic module so as to prevent damage of the electronic element when the electronic module is subjected to an SMT (Surface Mount Technology) process or transported, thus improving the product yield.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2G are schematic cross-sectional views showing a method for fabricating an electronic module 2 according to the present invention.

Figure 1:
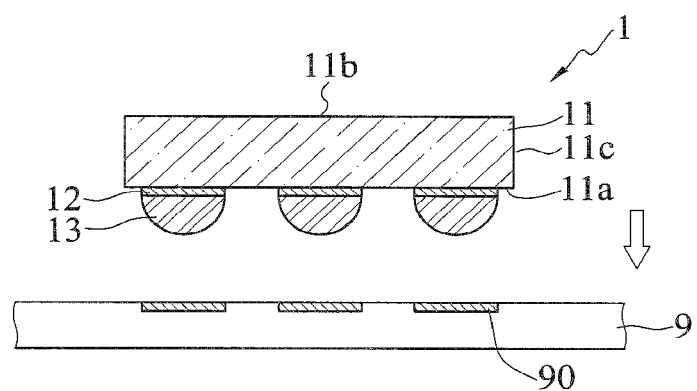
FIG. 1 is a schematic exploded cross-sectional view of a conventional flip-chip package.
Figure 2A:
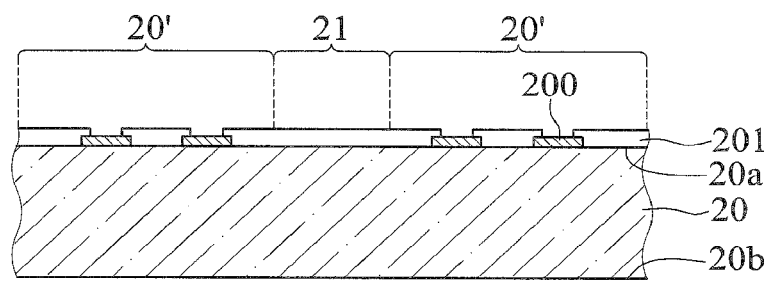
FIGS. 2A to 2G are schematic cross-sectional views showing a method for fabricating an electronic module according to the present invention, wherein FIGS. 2C' and 2G' show another embodiment of FIGS. 2C and 2G.

Referring to FIG. 2A, a full-panel substrate 20 is provided, which has a plurality of electronic elements 20' and a plurality of separation portions 21 formed between the electronic elements 20'.

In the present embodiment, each of the electronic elements 20' has an active surface 20a with a plurality of electrode pads 200 and an inactive surface 20b opposite to the active surface 20a. Further, a passivation layer 201 is formed on the active surfaces 20a of the electronic elements 20', and the electrode pads 200 of the electronic elements 20' are exposed from the passivation layer 201.

Each of the electronic elements 20' can be an active element such as a semiconductor chip, a passive element such as a resistor, a capacitor or an inductor, or a combination thereof. In the present embodiment, the substrate 20 is a silicon wafer, and the electronic elements 20' are active elements.

Figure 2B:
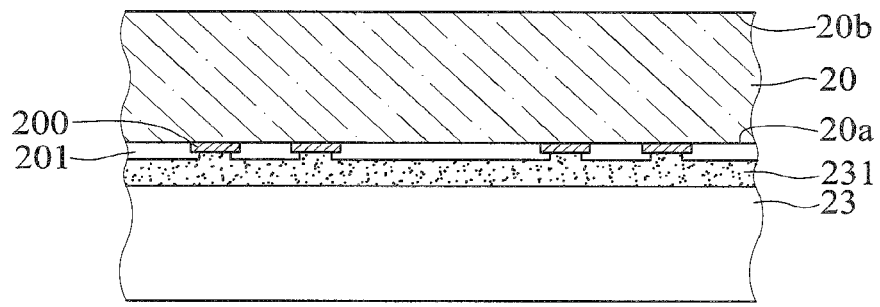

Referring to FIG. 2B, a carrier 23 is disposed on the passivation layer 201. In the present embodiment, a release layer 231 is formed between the carrier 23 and the passivation layer 201 so as to facilitate subsequent removal of the carrier 23 from the passivation layer 201.

Figure 2C:
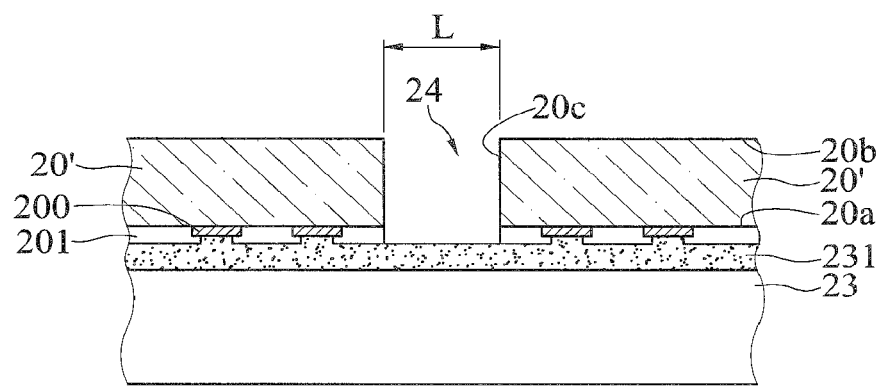
Figure 2C:
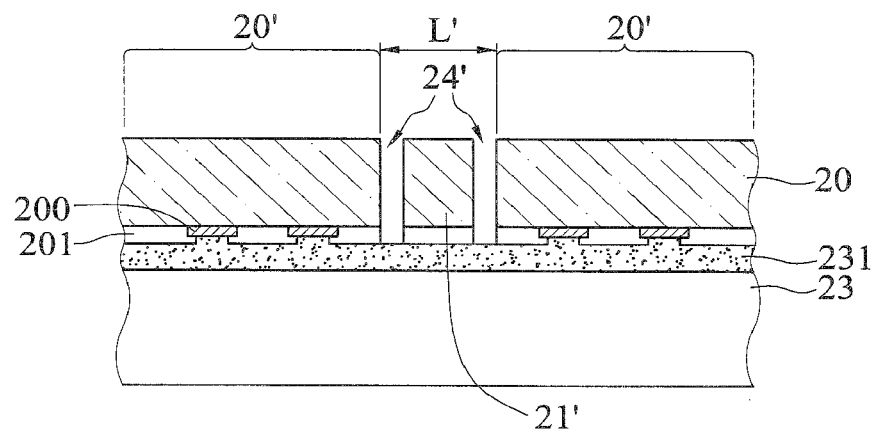

Referring to FIG. 2C, an opening 24 is formed in each of the separation portions 21 by cutting. As such, each of the electronic elements 20' has a side surface 20c connecting the active and inactive surfaces 20a, 20b of the electronic element 20'.

In the present embodiment, each of the separation portions 21 is completely removed to form the opening 24. The width L of the opening 24, i.e., the width of the separation portion 21, is in a range of 10 um to 3 mm. Further, the inactive surfaces 20b of the electronic elements 20' can be optionally thinned by grinding.

In another embodiment, referring to FIG. 2C', during the cutting process, a plurality of openings 24' are formed in each of the separation portions 21. That is, each of the separation portions 21 is partially removed, leaving a remaining portion 21'. The width L' of the separation portion 21 is in a range of 15 um to 4 mm.

Figure 2D:
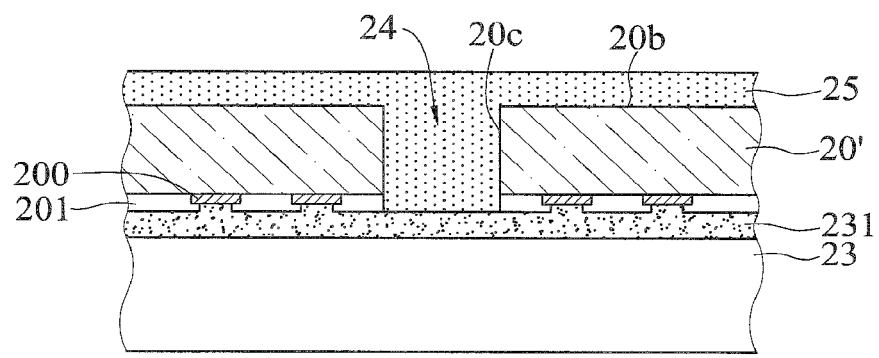

Referring to FIG. 2D, a strengthening layer 25 is formed in the openings 24 and on the electronic elements 20' so as to cover the side surfaces 20c and the inactive surfaces 20b of the electronic elements 20'.

In the present embodiment, the strengthening layer 25 is completely filled in the openings 24 and formed around the side surfaces 20c of the electronic elements 20'. The strengthening layer 25 is made of an insulating material, for example, a molding compound material, a dry film material, a photoresist material or a solder mask material.

Figure 2E:
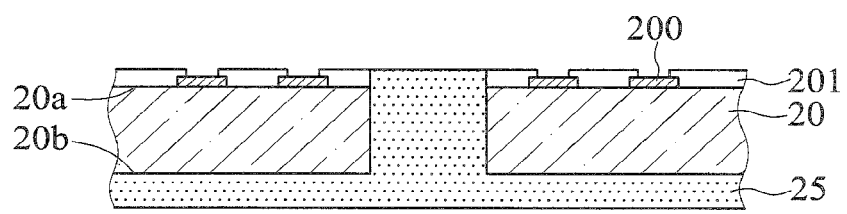

Referring to FIG. 2E, the carrier 23 and the release layer 231 are removed to expose the electrode pads 200 of the electronic elements 20', the passivation layer 201 and the strengthening layer 25.

Figure 2F:
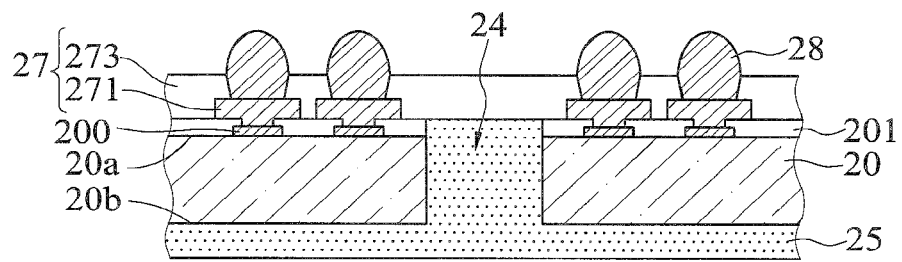

Referring to FIG. 2F, an RDL (Redistribution Layer) process is performed to form an RDL structure 27 on the passivation layer 201. The RDL structure 27 is electrically connected to the electrode pads 200 of the electronic elements 20'. Then, a plurality of conductive elements 28 are formed on the RDL structure 27.

In the present embodiment, the RDL structure 27 has a circuit layer 271 formed on the passivation layer 201 and electrically connected to the electrode pads 200 of the electronic elements 20', and an insulating layer 273 formed on the circuit layer 271. Further, portions of the circuit layer 271 are exposed from the insulating layer 273 for mounting the conductive elements 28.

The conductive elements 28 are solder balls, metal bumps or a combination thereof.

Figure 2G:
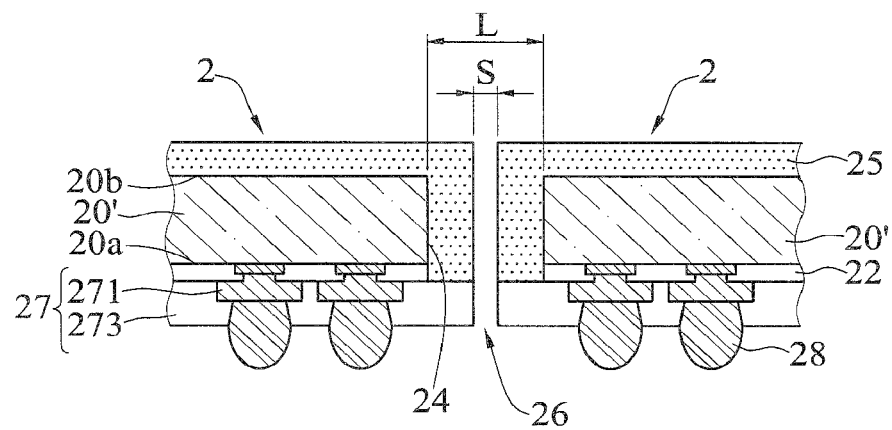
Figure 2G:
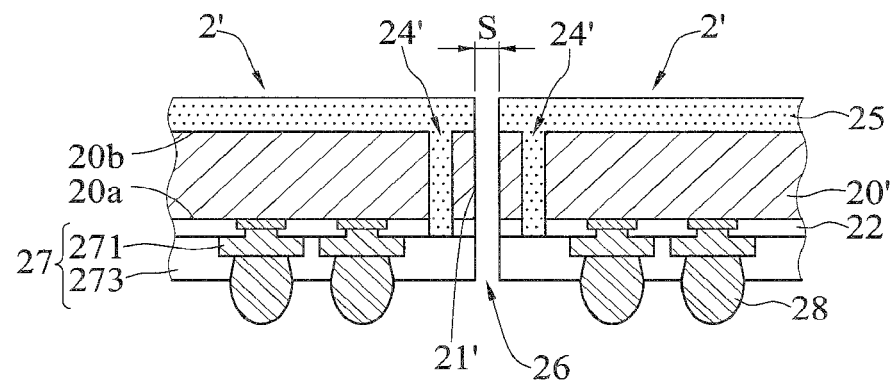

Referring to FIG. 2G, a singulation process is performed. That is, the full-panel substrate 20 is cut along a cutting path 26 (i.e., along the separation portions 21) so as to separate the electronic elements 20' from one another, thus foliating a plurality of electronic modules 2.

In the present embodiment, the width S of the cutting path 26 is less than the width L of the openings 24.

In another embodiment, continued from FIG. 2C', the cutting path 26 is positioned between the openings 24', as shown in FIG. 2G'. As such, a plurality of electronic modules 2' are obtained. Each of the electronic modules 2' has a separation portion 21' embedded in the strengthening layer 25 on the side surface of the electronic element 20'. That is, the openings 24' are positioned between the separation portion 21' and the electronic element 20', and the surface of the separation portion 21' is flush with the side surface of the strengthening layer 25. The RDL structure 27 is formed on the strengthening layer 25, the separation portion 21' and the active surface 20a of the electronic element 20' and electrically connected to the electrode pads 200 of the electronic element 20'.

Further, the strengthening layer 25 can be partially removed so as to expose the inactive surface 20b of the electronic element 20'. For example, the inactive surface 20b of the electronic element 20' is flush with the upper surface of the strengthening layer 25, as shown in FIG. 3B.

Therefore, by forming the strengthening layer 25 to encapsulate the electronic element 20', the present invention strengthens the structure of the electronic module 2, 2' so as to prevent damage of the electronic element 20' when the electronic module 2, 2' is subjected to an SMT (Surface Mount Technology) process or transported, thus improving the product yield.

Figure 3A:
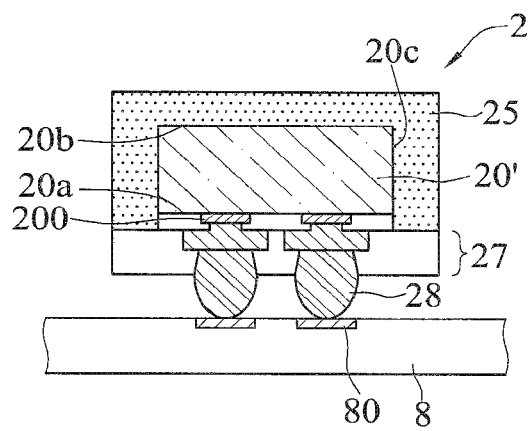
FIGS. 3A and 3B are schematic cross-sectional views showing different embodiments of the electronic module of the present invention, wherein FIGS. 3A' and 3B' are schematic upper views of FIGS. 3A and 3B, respectively.
Figure 3A:
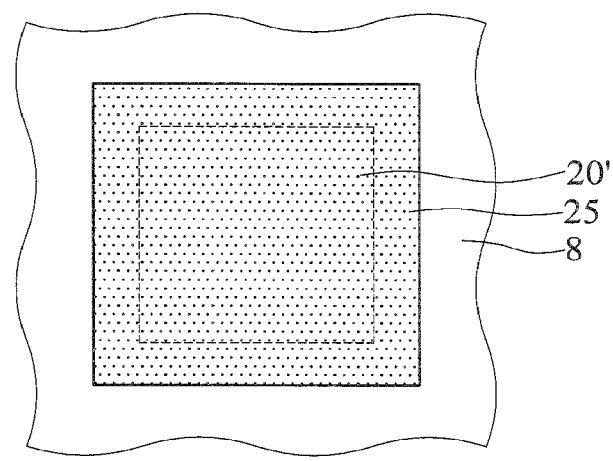
Figure 3B:
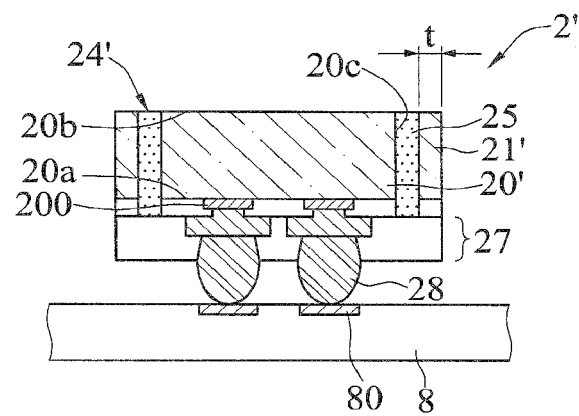
Figure 3B:
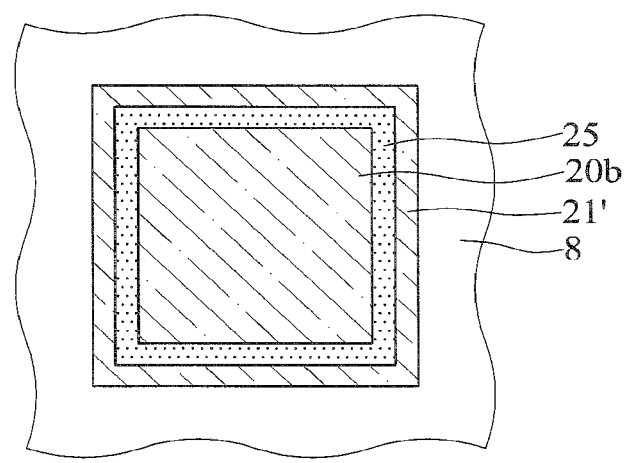

Referring to FIGS. 3A and 3B, the present invention further provides an electronic module 2, 2', which has: an electronic element 20' having an active surface 20a with a plurality of electrode pads 200, an inactive surface 20*b* opposite to the active surface 20*a*, and a side surface 20*c* connecting the active and inactive surfaces 20*a*, 20*b*; and a strengthening layer 25 formed on the side surface 20*c* of the electronic element 20' but not formed on the active surface 20*a* of the electronic element 20'.

The strengthening layer 25 can be made of an insulating material.

The electronic module 2, 2' can further have an RDL structure 27 formed on the strengthening layer 25 and the active surface 20*a* of the electronic element 20' and electrically connected to the electrode pads 200 of the electronic element 20'.

The electronic module 2, 2' can further have a plurality of conductive elements 28 formed on the active surface 20*a* of the electronic element 20' (or the RDL structure 27) and electrically connected to the electrode pads 200 of the electronic element 20'.

In an embodiment, referring to FIGS. 3A' and 3B', the strengthening layer 25 are formed around the side surface 20*c* of the electronic element 20'.

In an embodiment, the strengthening layer 25 is further formed on the inactive surface 20*b* of the electronic element 20', as shown in FIG. 3A. Alternatively, the inactive surface 20*b* of the electronic element 20' is exposed from the strengthening layer 25, as shown in FIG. 3B.

In an embodiment, the electronic module 2' further has a separation portion 21' formed on the strengthening layer 25 on the side surface 20*c* of the electronic element 20' in a manner that the strengthening layer 25 is sandwiched between the side surface 20*c* of the electronic element 20' and the separation portion 21'. Further, the RDL structure 27 is formed on the separation portion 21'. The width t of the separation portion 21' is less than 1 mm.

In an embodiment, the electronic element 20' is flip-chip disposed on a packaging substrate 8 via the active surface 20*a* thereof, with the conductive elements 28 bonded to the conductive pads 80 of the packaging substrate 8.

Therefore, the present invention strengthens the structure of the electronic module through the strengthening layer so as to prevent damage of the electronic element and improve the product yield.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating an electronic module, comprising the steps of:
   providing a substrate having a plurality of electronic elements and a plurality of separation portions each formed between adjacent two of the electronic elements, wherein each of the electronic elements has an active surface with a plurality of electrode pads and an inactive surface opposite to the active surface;
   disposing the substrate on a carrier, wherein the active surface of each of the electronic elements is disposed on the carrier;
   after disposing the substrate on the carrier, removing each of the separation portions to form at least an opening in each of the separation portions, causing each of the electronic elements to have a side surface connecting the active and inactive surfaces thereof;
   forming a strengthening layer in the openings of the separation portions and on the side surfaces of the electronic elements; and
   singulating the electronic elements along the opening.

2. The method of claim 1, wherein the separation portions have a width in a range of 10 um to 4 mm.

3. The method of claim 1, wherein the strengthening layer is formed around the side surfaces of the electronic elements.

4. The method of claim 1, wherein the strengthening layer is made of an insulating material.

5. The method of claim 1, wherein the singulation path along the separation portions is less in width than the separation portions.

6. The method of claim 1, wherein if a plurality of openings are formed in each of the separation portions, the singulation path along the separation portion is positioned between the openings of the separation portion.

7. The method of claim 1, wherein the strengthening layer is further formed on the inactive surfaces of the electronic elements.

8. The method of claim 1, before singulating the electronic elements, further comprising forming an RDL structure on the strengthening layer, the separation portion and the active surface of each of the electronic elements, wherein the RDL structure is electrically connected to the electrode pads of the electronic element.

9. The method of claim 1, before singulating the electronic elements, further comprising forming an RDL structure on the strengthening layer and the active surface of each of the electronic elements, wherein the RDL structure is electrically connected to the electrode pads of the electronic element.

10. The method of claim 1, further comprising forming a plurality of conductive elements on the active surface of each of the electronic elements, wherein the conductive elements are electrically connected to the electrode pads of the electronic element.

11. The method of claim 1, after singulating the electronic elements, further comprising bonding each of the electronic elements to a packaging substrate via the active surface thereof.

\* \* \* \* \*